United States Patent [19]
McClure

[11] Patent Number: 5,339,277
[45] Date of Patent: Aug. 16, 1994

[54] ADDRESS BUFFER

[75] Inventor: David C. McClure, Carrollton, Tex.

[73] Assignee: SGS-Thomson Microelectronics, Inc., Carrollton, Tex.

[21] Appl. No.: 56,078

[22] Filed: Apr. 30, 1993

[51] Int. Cl.$^5$ .............................................. G11C 8/00
[52] U.S. Cl. .......................... 365/230.08; 365/189.05; 365/201
[58] Field of Search ............... 365/230.08, 201, 189.05

[56] References Cited
U.S. PATENT DOCUMENTS 4,651,304  3/1987  Takata .................................. 365/201
5,208,776  5/1993  Nosu et al. ........................... 365/200

Primary Examiner—Eugene R. LaRoche
Assistant Examiner—F. Niranjan
Attorney, Agent, or Firm—Kenneth C. Hill; Lisa K. Jorgenson; Richard K. Robinson

[57] ABSTRACT

An address buffer which allows for the simultaneous selection and/or deselection of a plurality of rows and/or columns within a memory array. A first and a second circuit generate a true and a complementary signal, respectively, during normal operations of the integrated circuit. When desired, the first and second circuits may be used to generate two signals of the same voltage level. The two signals of the same voltage level may then be used by an address decoder to simultaneously select and/or deselect a plurality of rows and/or columns within a memory array.

23 Claims, 1 Drawing Sheet

ADDRESS BUFFER

BACKGROUND OF THE INVENTION

1. Field of the Invention

The present invention relates in general to integrated circuits, and more particularly to memory arrays in integrated circuits. Still more particularly, the present invention relates to address buffers.

2. Description of the Prior Art

Address buffers are used in many circuits, with one example being memory arrays. Address buffers are used, in conjunction with decoders, to select row or bit lines within a memory array. Usually only a certain number of row and bit lines may be selected at any point in time.

For some test or operating modes of the memory array, however, selection of all or a portion of row and/or bit lines at a single time is desirable. An example of a test mode where selecting all or a portion of the row and bit lines at a single time is necessary is described in co-pending U.S. patent application Ser. No. 07/954,276, entitled *Stress Test For Memory Arrays In Integrated Circuits*, filed Sep. 30, 1992. A plurality of rows are selected at one time and a stress voltage is placed on a plurality of bit and complementary bit lines. In this manner the memory cells within the memory array are stress tested in order to detect latent defects.

Another example of a test mode where selecting all of the row and bit lines at a single time is necessary is described in co-pending U.S. patent application Ser. No. 08/05,376, entitled *Method for Testing Stress Decoders And Periphery Circuits*, filed Apr. 30, 1993. A plurality of rows and bit lines are selected or deselected simultaneously and a stress voltage is applied to the integrated circuit. In this manner, latent defects within the decoders and periphery circuits can be detected.

Therefore, it is desirable to provide a circuit which allows for the simultaneous selection or deselection of a plurality of rows and columns within a memory array. It is also desirable that such a circuit be compact and not significantly affect the normal operation of the integrated circuit.

SUMMARY OF THE INVENTION

An address buffer is provided which allows for the simultaneous selection or deselection of a plurality of rows and/or columns within a memory array. A first and a second circuit generate a true and a complementary signal, respectively, during normal operations of the integrated circuit. When desired, the first and second circuits may be used to generate two signals of the same voltage level. The two signals of the same voltage level may then be used by an address decoder to simultaneously select or deselect a plurality of rows and/or columns within a memory array.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
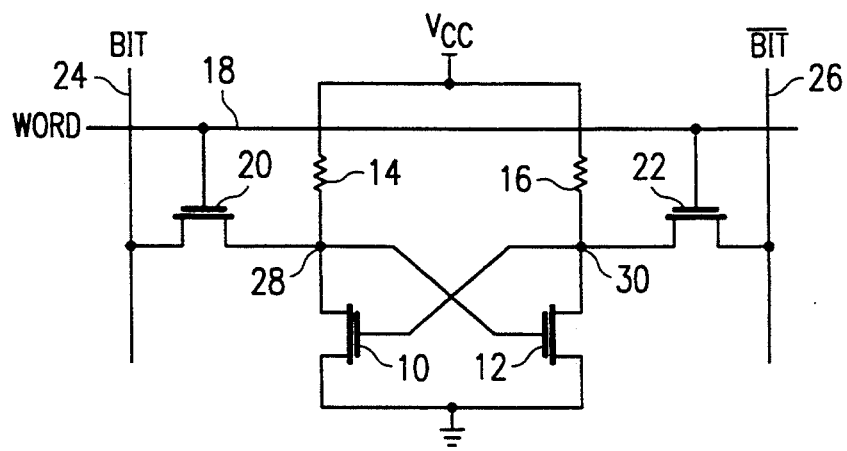
FIG. 1 is a circuit diagram illustrating a memory cell within a memory array.

Referring to FIG. 1, a circuit diagram of a memory cell is illustrated. As can be seen, a first transistor 10, a second transistor 12, a first load element 14, and a second load element 16 are arranged in a flip-flop configuration. In the preferred embodiment, load elements 14, 16 are resistors, but those skilled in the art will recognize that p-channel transistors may also be used for load elements 14, 16.

Row line 18, labeled word, is connected to the gate of a third transistor 20 and fourth transistor 22. Row line 18 is utilized to activate the cell. Signal lines 24, 26 labeled bit and bit bar, respectively, are then utilized to write data to and read data from the cell. In this manner, third and fourth transistor 20, 22 act as select transistors, and first transistor 10 and second transistor 12 are storage transistors.

Data is stored as voltage levels with the two sides of the flip-flop in opposite voltage configurations. The memory cell has two stable states, high or logic 1, and low or logic 0. If the memory cell is storing a logic 1, node 28 is high and node 30 is low, with first transistor 10 turned off and second transistor 12 turned on. The logic 0 state would be the opposite, with node 28 low and node 30 high.

Figure 2:
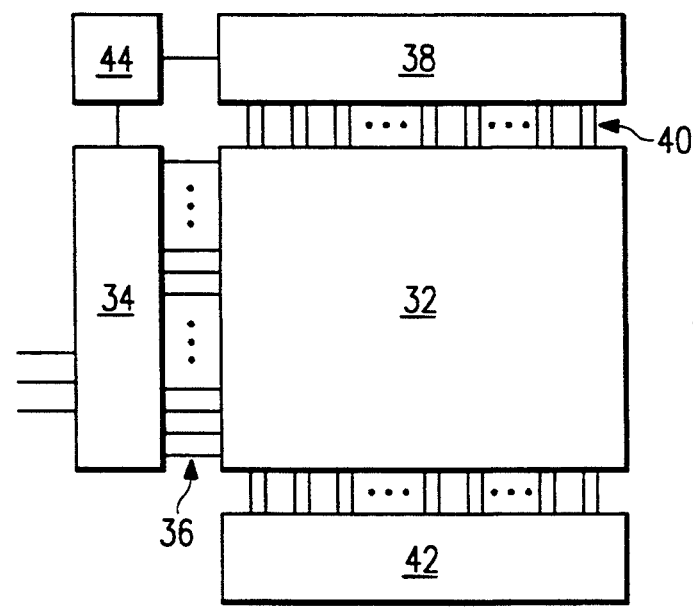
FIG. 2 is a block diagram illustrating a portion of the circuitry in a memory integrated circuit.

The memory cell illustrated in FIG. 1 is embedded in an array of similar cells. FIG. 2 is a block diagram of the circuitry associated with a memory array in an integrated circuit according to the present invention. Memory array 32 is accessed by a row decoder 34 which selects a word line from a plurality of word lines 36. A column decoder 38 selects the appropriate bit and bit bar lines from a plurality of bit and bit bar lines 40. Write decoder 42 is utilized to write data into the memory array 32. Although column decoder 38 and write decoder 42 are depicted as separate circuits, those skilled in the art will recognize that column decoder 38 and write decoder 42 may be combined as one circuit. Block 44 represents a plurality of address buffers which generate control signals used by row decoder 34 and/or column decoder 38. The control signals from block 44 cause row decoder 34 to select all or a portion of the word lines at one time. The control signals from block 44 may also be used by column decoder 38 to select all or a portion of the bit lines in the array.

Figure 3:
FIG. 3 is a circuit diagram illustrating a circuit for an address buffer according to the present invention.

FIG. 3 is a circuit diagram illustrating a circuit for an address buffer according to the present invention. First inverter 46, second inverter 48, third inverter 50, and fourth inverter 52 are connected in series between an address pad 54 and a first output signal line 56, labelled $A_{TRUE}$. Connected to the output of second inverter 48 is an input into pass gate 58. Fifth inverter 60 is connected between the output of pass gate 58 and second output signal line 62, labelled $A_{COMP}$. In the preferred embodiment, $A_{TRUE}$ and $A_{COMP}$ are input into an address decoder (not shown).

Inverters 46, 48, 50, 52 placed between address pad 54 and first output signal line 56 are used to increase drive capacity for the signal $A_{TRUE}$. Inverters 46, 48, 50, 52 also result in a time delay for $A_{TRUE}$. In the preferred embodiment, pass gate 58 is used between second inverter 48 and fifth inverter 60 to make the time delay for $A_{COMP}$ equal to the time delay of $A_{TRUE}$, and to optimize the crossing point of $A_{TRUE}$ and $A_{COMP}$ during the transition.

As known in the art, pass gate 58 is composed of an n-channel transistor 64 and a p-channel transistor 66 with a common source and drain. Signal 68, labelled TST, is used to control pass gate 58. When the signal on TST is low, p-channel transistor 66 is turned on. Additionally, sixth inverter 70 inverts the signal and n-channel transistor 64 is turned on. With both transistors turned on, signal 72, labelled $F_{OFF}$, set high, and signal 74, labelled $F_{ON}$ set low, the pass gate conducts and $A_{COMP}$ and $A_{TRUE}$ are complementary signals.

The integrated circuit is preferably in a testing or special operating mode when both output signals $A_{COMP}$ and $A_{TRUE}$ are set to the same voltage level. To set both signals to the same voltage level, TST is set high. Address pad 54, signal 72, signal 74, pull up transistor 76 and pull down transistor 78 are then used to select the voltage level both $A_{COMP}$ and $A_{TRUE}$ are to be set to, as will be described in greater detail below.

For a first example, if both $A_{COMP}$ and $A_{TRUE}$ need to be high, a high voltage level is placed on address pad 54. This causes $A_{TRUE}$ to be a high voltage level. To get $A_{COMP}$ to be a high voltage level, $F_{OFF}$ and $F_{ON}$ are set to a high voltage level. This causes pull up transistor 76 to be turned off and pull down transistor 78 to be on. With pull down transistor 78 on, node 80 is set to a low voltage level, which fifth inverter 60 inverts to a high voltage level. Thus, both $A_{TRUE}$ and $A_{COMP}$ are set at a high voltage state.

If the address decoders (not shown) which have $A_{TRUE}$ and $A_{COMP}$ as inputs are composed of NAND gates, and these NAND gates are used to select rows in a memory array, then all of the NAND gates have a low voltage level as their output states. This causes all of the rows in the memory array to be selected. If the NAND gates are used as decoders for column selection in the memory array, then all of the columns in the memory array are selected in this same manner.

Alternatively, if both $A_{COMP}$ and $A_{TRUE}$ need to be at a low voltage level, a low voltage level is placed on address pad 54. This causes $A_{TRUE}$ to be a low voltage level. To get $A_{COMP}$ to be at a low voltage level, $F_{OFF}$ and $F_{ON}$ are set to a low voltage level. This causes pull up transistor 76 to be turned on and pull down transistor 78 to be turned off. With pull up transistor 76 on, node 80 is set to a high voltage level, which fifth inverter 60 inverts to a low voltage level. Thus, both $A_{TRUE}$ and $A_{COMP}$ are set at a low voltage state.

Continuing with this second example, if the address decoders (not shown) which have $A_{TRUE}$ and $A_{COMP}$ as inputs are composed of NAND gates, and these NAND gates are used to select rows in a memory array, then all of the NAND gates have a high voltage level as their output states. This causes all of the rows in the memory array to not be selected. If the NAND gates are used as decoders for column selection in the memory array, then all of the columns in the memory array are not selected in this same manner.

An example of a test mode where selecting all or a portion of the row and bit lines at a single time is necessary is described in co-pending U.S. patent application Ser. No. 07/954,276, entitled *Stress Test For Memory Arrays In Integrated Circuits*, filed Sep. 30, 1992. A plurality of rows are selected at one time and a stress voltage is placed on a plurality of bit and complementary bit lines. As described in greater detail in the application, memory cells within the memory array are then stress tested in order to detect latent defects.

Another example of a test mode where selecting all or a portion of the row and bit lines at a single time is necessary is described in co-pending U.S. patent application Ser. No. 08/056,376, entitled *Method for Stress Testing Decoders and Periphery Circuits*, filed Apr. 30, 1993. A plurality of rows and/or bit lines are simultaneously selected or deselected and a stress voltage is applied to the integrated circuit. In this manner, latent defects within the decoders and periphery circuits may be detected.

An example of a special operating mode where selecting all or a portion of the row lines at a single time is necessary is during a bulk write into a memory array. After selecting all or a portion of the row lines, data is written into the memory array. Bulk writes are desirable when, for example, a memory array is flash cleared.

The above described address buffer supplies a means for providing a true or false stimulus to a number of row and/or column decoders. In the preferred embodiment, the address buffer provides an operation mode which simultaneously selects or deselects a plurality of rows and/or columns within a memory array. The preferred circuit is constructed so that it achieves equal time delays for $A_{TRUE}$ and $A_{COMP}$, and optimizes the crossing point of $A_{TRUE}$ and $A_{COMP}$ during normal operations. Additionally, the preferred circuit does not affect the normal operations of the integrated circuit and is compact, so it does not consume much area in the integrated circuit.

Although FIG. 3 illustrates a circuit for an address buffer according to the present invention, those skilled in the art will appreciate that other circuits may be used to construct an address buffer according to the present invention. For example, different logic gates may be used, or the number of logic gates may be varied. Alternatively, only a pull transistor or a pull down transistor may be needed. Thus, the circuit used to supply a means for providing a true or false stimulus to a number of row and/or column decoders may be altered to meet the needs of a user.

While the invention has been particularly shown and described with reference to a preferred embodiment, it will be understood by those skilled in the art that various changes in form and detail may be made therein without departing from the spirit and scope of the invention.

What is claimed is:

1. An address buffer in an integrated circuit, comprising:
   a first circuit which generates a true signal, wherein a delay occurs in generating the true signal; and
   a second circuit which generates a complementary signal during normal operations of the integrated circuit, and during a special operating mode of the integrated circuit the second circuit generates a control signal that matches a voltage level of the true signal, wherein the second circuit includes a circuit which provides a delay in the second circuit that matches the delay in the first circuit.

2. The address buffer of claim 1, further comprising an address decoder for a memory array connected to the address buffer, wherein the first and second control signals are used by the address decoder to select or deselect a plurality of rows within a memory array.

3. The address buffer of claim 1, further comprising an address decoder for a memory array connected to the address buffer, wherein the first and second control signals are used by the address decoder to select or deselect a plurality of columns within a memory array.

4. The address buffer of claim 1, wherein the special operating mode comprises a test mode.

5. The address buffer of claim 1, wherein the second circuit includes a pass gate so that the time delay of the first circuit and the second circuit is equal.

6. The address buffer of claim 5, wherein the second circuit further includes a pull up transistor and a pull down transistor connected to the output of the pass gate.

7. The address buffer of claim 6, wherein the pass gate conducts when both the pull up and pull down transistors are turned off, and does not conduct when either the pull up or pull down transistor is turned on.

8. The address buffer of claim 1, wherein the first and second control signals comprise a high voltage.

9. The address buffer of claim 1, Wherein the first and second control signals comprise a low voltage.

10. The address buffer of claim 1, wherein the second circuit comprises:
an input signal line;
a pass gate, wherein the pass gate is designed to provide the second delay;
at least one logic gate connected in series between the input signal line and an input of the pass gate;
a first inverter connected to an output of the pass gate; and
a pull up transistor and a pull down transistor connected to the output of the pass gate.

11. An address buffer in an integrated circuit, comprising:
a first circuit which generates a true signal during normal operations of the integrated circuits, and special operating mode of the integrated circuit the first circuit generates a first control signal, wherein the first circuit comprises a second inverter and a third inverter connected in series to the output of the at least one logic gate ; and
a second circuit which generates a complementary signal during normal operations of the integrated circuit, and during a special operating mode of the integrated circuit the second circuit generates a second control signal, wherein the second circuit includes an input signal line; a pass gate; at least one logic gate connected in series between the input signal line and an input of the pass gate; a first inverter connected to an output of the pass gate; and a pull up transistor and a pull down transistor connected to the output of the pass gate, wherein the first and second control signals are set to the same voltage level.

12. The address buffer of claim 10, wherein the voltage level of the first and second control signals is determined by the voltage on the input signal line, the states of the pull up and pull down transistors and the state of the pass gate.

13. An address buffer in an integrated circuit, comprising:
an input signal line;
a pass gate;
at least one logic gate connected in series between the input signal line and an input to the pass gate;
a pull up transistor and a pull down transistor connected to an output of the pass gate, wherein the pull up and pull down transistors are used to generate a first control signal; and
a first inverter and a second inverter connected in series to the output of the at least one logic gate, wherein the at least one logic gate, the first and second inverters are used to generate a second control signal, and wherein the first control signal and the second control signal are set to a single output voltage level during a special operating mode of the integrated circuit.

14. The address buffer of claim 13, further comprising an address decoder for a memory array connected to the address buffer, wherein the first and second control signals are used by the address decoder to select or deselect a plurality of rows within a memory array.

15. The address buffer of claim 13, further comprising an address decoder for a memory array connected to the address buffer, wherein the first and second control signals are used by the address decoder to select or deselect a plurality of columns within a memory array.

16. The address buffer of claim 13, wherein the special operating mode comprises a test mode.

17. An address buffer in an integrated circuit, comprising:
an input signal line;
a pass gate;
a first inverter and a second inverter connected in series between the input signal line and an input to the pass gate;
a pull up transistor and a pull down transistor connected to an output of the pass gate, wherein the pull up and pull down transistors are used to generate a first control signal; and
a third inverter and a fourth inverter connected in series to the output of the second inverter, wherein the first, second, third and fourth inverters are used to generate a second control signal, and wherein the first and second control signals are set to a single output voltage level during a special operating mode of the integrated circuit.

18. The address buffer of claim 17, further comprising an address decoder for a memory array connected to the address buffer, wherein the first and second control signals are used by the address decoder to select or deselect a plurality of rows within a memory array.

19. The address buffer of claim 17, further comprising an address decoder for a memory array connected to the address buffer, wherein the first and second control signals are used by the address decoder to select or deselect a plurality of columns within a memory array.

20. The address buffer of claim 17, wherein the special operating mode comprises a test mode.

21. The address buffer of claim 7, wherein the voltage level of the first and second control signals is determined by the voltage on the input signal line, the states of the pull up and pull down transistors and the state of the pass gate.

22. The address buffer of claim 13, further comprising a third inverter connected to the output of the pass gate for generating the first control signal in conjunction with the pull up and pull down transistors.

23. The address buffer of claim 17, further comprising a third inverter connected to the output of the pass gate for generating the first control signal in conjunction with the pull up and pull down transistors.

* * * * *